(12) United States Patent
Lin et al.

(10) Patent No.: US 11,217,606 B2
(45) Date of Patent: Jan. 4, 2022

(54) DEVICE SUBSTRATE, DISPLAY PANEL AND TILED DISPLAY COMPRISING ARRANGEMENT OF POWER LINES AND PADS

(71) Applicant: Au Optronics Corporation, Hsinchu (TW)

(72) Inventors: Chen-Chi Lin, Hsinchu County (TW); Peng-Bo Xi, Taipei (TW); Chia-Che Hung, Tainan (TW)

(73) Assignee: Au Optronics Corporation, Hsinchu (TW)

( * ) Notice: Subject to any disclaimer, the term of this patent is extended or adjusted under 35 U.S.C. 154(b) by 252 days.

(21) Appl. No.: 16/373,597

(22) Filed: Apr. 2, 2019

(65) Prior Publication Data

US 2019/0326327 A1    Oct. 24, 2019

Related U.S. Application Data

(60) Provisional application No. 62/659,662, filed on Apr. 18, 2018.

(30) Foreign Application Priority Data

Dec. 11, 2018  (TW) ................................. 107144412

(51) Int. Cl.
*H01L 25/075* (2006.01)
*H01L 33/62* (2010.01)
(Continued)

(52) U.S. Cl.
CPC ............ *H01L 27/124* (2013.01); *H01L 24/06* (2013.01); *H01L 25/0753* (2013.01);
(Continued)

(58) Field of Classification Search
CPC ......... H01L 24/02; H01L 24/04; H01L 24/06; H01L 25/167; H01L 27/124;
(Continued)

(56) References Cited

U.S. PATENT DOCUMENTS 6,614,056 B1* 9/2003 Tarsa ..................... H01L 33/20
257/91
9,275,573 B2  3/2016 Lee et al.
(Continued)

FOREIGN PATENT DOCUMENTS

| CN | 103093740 | 5/2013 |
| CN | 203242247 | 10/2013 |
| CN | 105516629 | 4/2016 |

*Primary Examiner* — Eduardo A Rodela
*Assistant Examiner* — Christopher M Roland
(74) *Attorney, Agent, or Firm* — JCIPRNET

(57) ABSTRACT

A device substrate comprising a substrate, a first pad, a second pad, a plurality of first power lines, a plurality of second power lines, and a plurality of control units is provided. The first pad is disposed on the first side of the device substrate. The second pad is disposed on the second side of the device substrate. The second side is opposite the first side. The first power lines are electrically connected to the first pad. The second power lines are electrically connected to the second pad. The control unit is electrically connected to at least one of the first power line and the second power line. The first pad does not overlap the second pad in a first direction perpendicular to the first side or in a second direction perpendicular to the second side. A display panel is also provided. A tiled display is also provided.

9 Claims, 9 Drawing Sheets

(51) Int. Cl.
*H01L 27/12* (2006.01)
*H01L 25/16* (2006.01)
*H01L 23/00* (2006.01)
*H05K 5/00* (2006.01)

(52) U.S. Cl.
CPC ......... *H01L 25/167* (2013.01); *H05K 5/0017* (2013.01); *H05K 5/0021* (2013.01); *H01L 33/62* (2013.01); *H01L 2224/0603* (2013.01); *H01L 2224/06165* (2013.01)

(58) Field of Classification Search
CPC ............. H01L 27/3276; H01L 27/3288; H01L 27/3297; H01L 2224/06; H01L 2224/0601; H01L 2224/0603; H01L 2224/0605; H01L 2224/06051; H01L 2224/06165; H05K 5/0017; H05K 5/0021
See application file for complete search history.

(56) References Cited

U.S. PATENT DOCUMENTS

| | | | |
|---|---|---|---|
| D797,689 S * | 9/2017 | Yeh | H01L 33/38 D13/180 |
| 2009/0159909 A1* | 6/2009 | Lee | H01L 33/38 257/96 |
| 2011/0163346 A1* | 7/2011 | Seo | H01L 33/42 257/99 |
| 2012/0061711 A1* | 3/2012 | Li | H01L 33/38 257/99 |
| 2014/0091992 A1 | 4/2014 | Lee et al. | |
| 2014/0231859 A1* | 8/2014 | Kim | H01L 33/387 257/99 |
| 2015/0236207 A1* | 8/2015 | Emura | H01L 24/00 257/99 |
| 2019/0019436 A1* | 1/2019 | Aoyagi | G09F 9/33 |
| 2020/0358251 A1* | 11/2020 | Tsuji | H01S 5/18308 |

* cited by examiner

DEVICE SUBSTRATE, DISPLAY PANEL AND TILED DISPLAY COMPRISING ARRANGEMENT OF POWER LINES AND PADS

CROSS-REFERENCE TO RELATED APPLICATION

This application claims the priority benefits of U.S. provisional application Ser. No. 62/659,662, filed on Apr. 18, 2018, and Taiwan application serial no. 107144412, filed on Dec. 11, 2018. The entirety of each of the above-mentioned patent applications is hereby incorporated by reference herein and made a part of this specification.

BACKGROUND

Technical Field

The disclosure relates to an electronic device or an electronic apparatus, and more particularly, to a device substrate, a display panel, or a tiled display.

Description of Related Art

When an electronic device or an electronic apparatus are in operation, the thermal energy generated by the high current is too concentrated, which may affect the power quality or safety of the electronic device or the electronic apparatus.

SUMMARY

The disclosure provides a device substrate having better power supply quality or safety.

The disclosure provides a display panel having better power supply quality or safety.

The disclosure provides a tiled display having better power supply quality or safety.

In an exemplary embodiment of the disclosure, a device substrate including a substrate, a first pad, a second pad, a plurality of first power lines, a plurality of second power lines, and a plurality of control units is provided. The first pad is disposed on the first side of the device substrate. The second pad is disposed on the second side of the device substrate. The second side is opposite the first side. The first power lines are electrically connected to the first pad. The second power lines are electrically connected to the second pad. The control unit is electrically connected to at least one of the first power line and the second power line. The first pad does not overlap the second pad in a first direction perpendicular to the first side or in a second direction perpendicular to the second side.

In an exemplary embodiment of the disclosure, a display panel including the aforementioned device substrate and a plurality of light emitting devices is provided. The light emitting devices are disposed on the device substrate and electrically connected to the device substrate.

In an exemplary embodiment of the disclosure, a tiled display including a first display panel and a second display panel is provided. The first display panel includes the aforementioned display panel. The second display panel includes the aforementioned display panel. The first pad of the first display panel is electrically connected to the first pad of the second display panel, or the second pad of the first display panel is electrically connected to the second pad of the second display panel.

Based on the above, in the device substrate of the present disclosure, the first pad electrically connected to the first power lines and the second pad electrically connected to the second power lines are disposed on opposite sides of the device substrate. Moreover, in a direction perpendicular to one of the aforementioned two sides, the first pad does not overlap the second pad. Therefore, the thermal energy generated by the shared large current during the operation of the device substrate, the display panels including thereof, or the tiled display including thereof may be dispersed, and the power supply quality or safety of the tiled display may be improved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
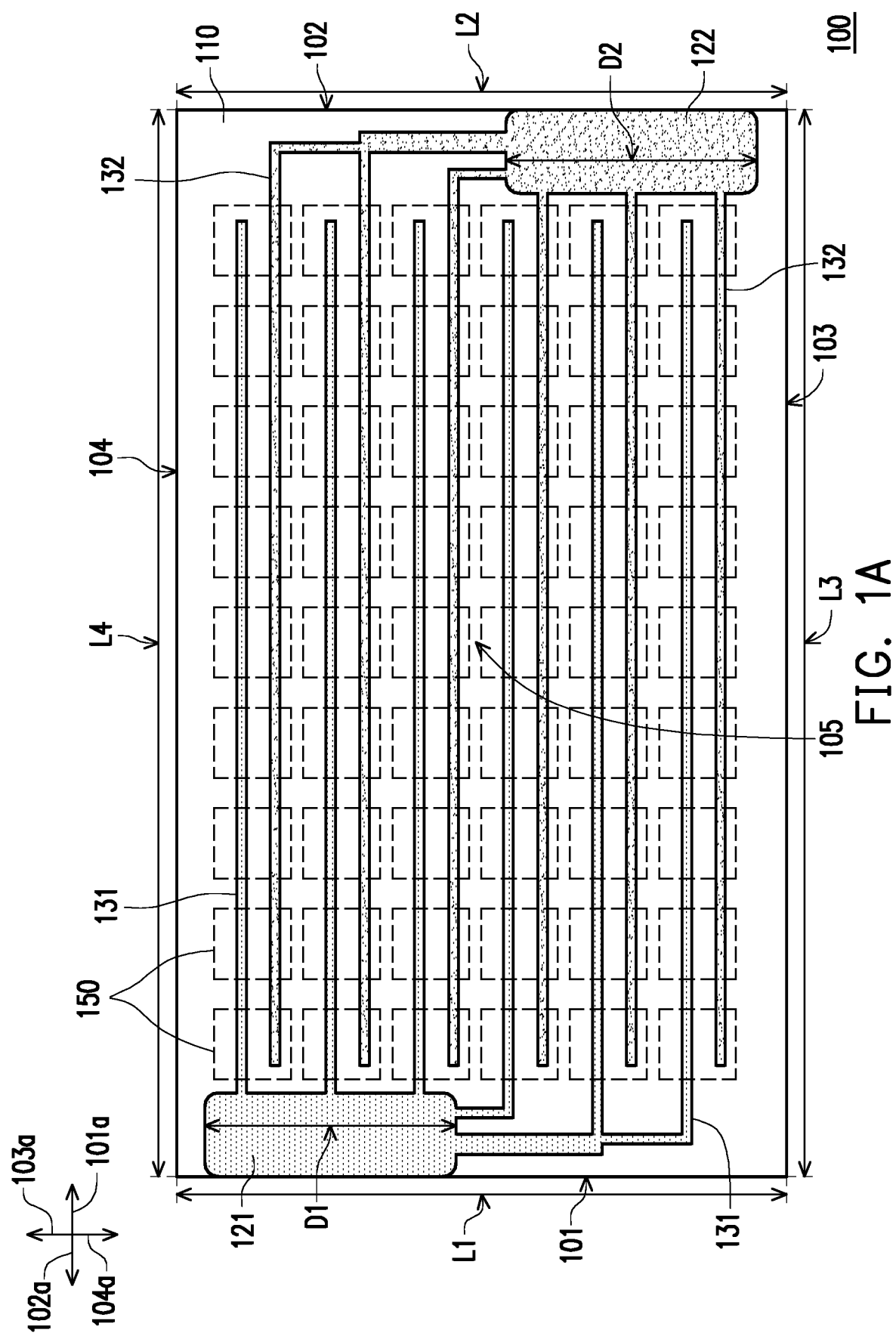
FIG. 1A is a top view of a device substrate of a first embodiment of the disclosure.

In the accompanying drawings, thicknesses of layers, films, panels, regions and so on are exaggerated for clarity. Throughout the specification, the same reference numerals in the accompanying drawings denote the same devices. It should be understood that when an element such as a layer, film, region or substrate is referred to as being "on another element," "connected to another element," or "overlapped to another element," it can be directly on or connected to the other element, or intervening elements may also be present. In contrast, when an element is referred to as being "directly on" or "directly connected to" another element, there are no intervening elements present. As used herein, the term "connected" may refer to physically connected and/or electrically connected. Furthermore, the "electrical connection" or "coupling" of the two devices may indicate that there are other devices between the two devices.

It should be understood that the terms "first," "second," "third," "fourth," "fifth," and "sixth" or "one," "another," and "still another" may be used to describe different elements in the disclosure, but these elements should not be limited by these terms. These terms are only used to distinguish the elements from one another. For instance, a first element may be referred to as a second element; similarly, a second element may be referred to as a first element without departing from the scope of the inventive concept. For instance, an element may also be referred to as another element; similarly, another element may be referred to as still another element without departing from the scope of the inventive concept.

The term used herein is for the purpose of describing particular embodiments and is not particularly limited. The articles "a," "an," and "the" are intended to include the plural forms as well, unless the context clearly indicates otherwise. Unless otherwise indicated, "or" means "and/or". As used herein, the term "and/or" includes any one and any combination of any two or more of the associated listed items. It is also to be understood that the terms "comprises," "includes," and "has" specify the presence of stated features, regions, steps, operations, elements, components, and/or combinations thereof, but the existence or addition of one or more other features, regions, steps, operations, elements, components, and/or combinations thereof are not excluded.

Further, relative terms such as "lower" or "bottom" and "upper" or "top" may be used herein for ease of description to describe one element's relationship to another element as shown in the figures. It will be understood that relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. Similarly, if the device in the figures is turned over, an element described as being "below" or "lower" relative to another element will then be "above" or "upper" relative to the other element. Thus, the term "below" encompasses both the below and above orientations depending on the spatial orientation of the device.

The term "about," "approximately," "similar," or "substantially" as used herein is inclusive of the stated value and means within an acceptable range of deviation for the particular value as determined by people having ordinary skill in the art, considering the measurement in question and the error associated with measurement of the particular quantity (i.e., the limitations of the measurement system), the process in question and the error associated with process of the particular quantity (i.e., the limitations of the process system), or the installation in question and the error associated with installation of the particular quantity (i.e., the limitations of the installation method). For instance, "about" may mean within one or more standard deviations, or within, for example, ±30%, ±20%, ±10%, or ±5% of the stated value. Moreover, a relatively acceptable range of deviation or standard deviation may be chosen for the term "about," "approximately," "similar," or "substantially" as used herein based on optical properties, etching properties, installation methods, visual perception or other properties, instead of applying one standard deviation across all the properties.

Unless otherwise defined, all terms (including technical and scientific terms) used herein have the same meaning as commonly understood by persons of ordinary skill in the art. It will be further understood that terms, such as those defined in commonly used dictionaries, should be interpreted as having a meaning that is consistent with their meaning in the context of the relevant art and the disclosure and will not be interpreted in an idealized or overly formal sense unless expressly so defined herein.

The IEEE, IEC, GB/T (Guobiao), JIS (Japanese Industrial Standards), and/or CNS (Chinese National Standards) standards are used as much as possible in the schematic views illustrating circuit connections. Certainly, there are several standards for circuitry symbols, which may vary from region to region, and some are slightly different, but those having ordinary skill in the pertinent art should understand the meaning.

Figure 1B:
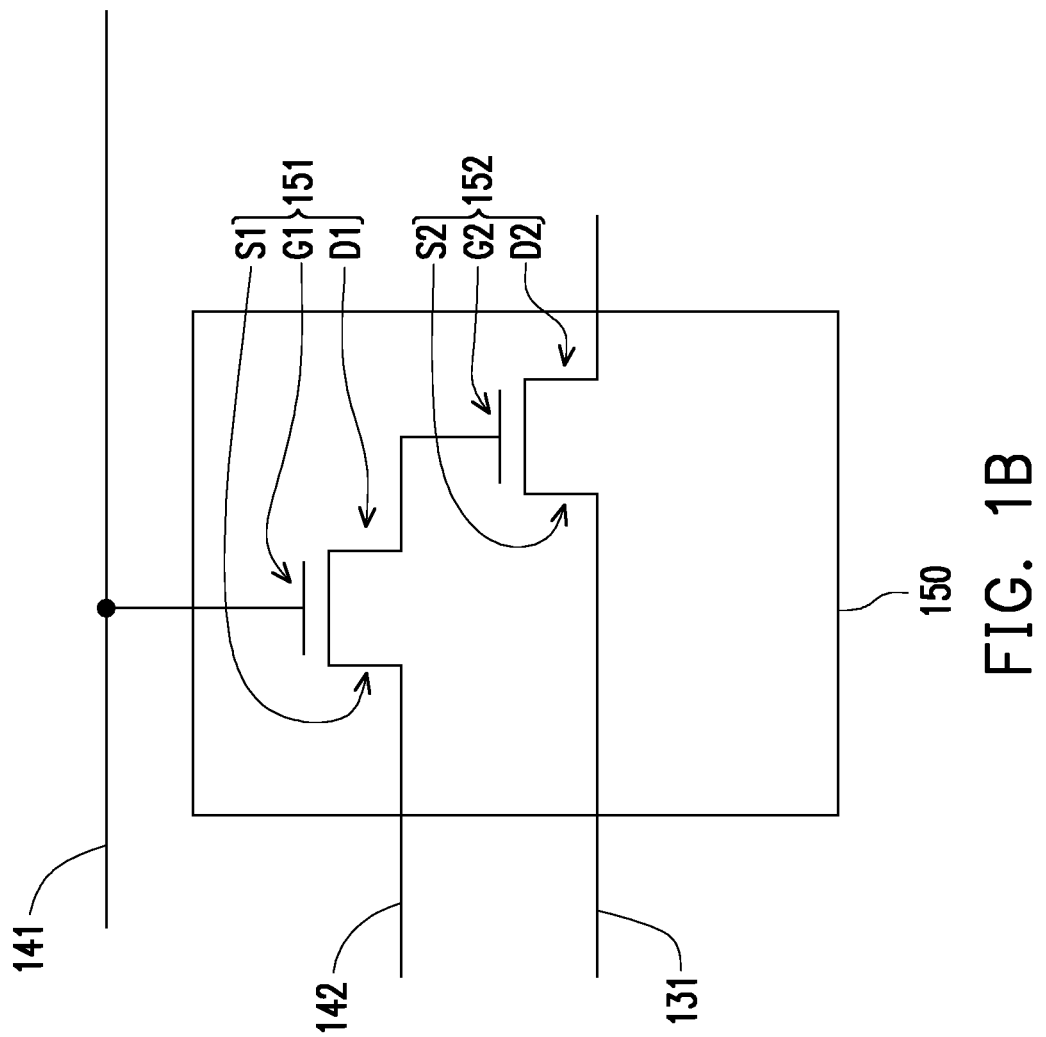
FIG. 1B is a partial circuit diagram of a device substrate of the first embodiment of the disclosure.

FIG. 1A is a top view of a device substrate of a first embodiment of the disclosure. FIG. 1B is a partial circuit diagram of a device substrate of the first embodiment of the disclosure. Specifically, FIG. 1B is a circuit diagram of a control unit including a device substrate of the first embodiment of the disclosure. In addition, a part of the film layer or device is omitted in FIGS. 1A and 1B for clarity.

Referring to FIG. 1A, the device substrate 100 has a first side 101, a second side 102, a third side 103, and a fourth side 104. The second side 102 is opposite the first side 101. The fourth side 104 is opposite the third side 103. The third side 103 connects one end of the first side 101 and one end of the second side 102. The fourth side 104 connects the other end of the first side 101 and the other end of the second side 102.

In the embodiment, the device substrate 100 may be substantially rectangular, but the disclosure is not limited thereto.

In the embodiment, if the device substrate 100 is substantially rectangular, the length L1 of the first side 101 and the length L2 of the second side 102 are smaller than the length L3 of the third side 103 and the length L4 of the fourth side 104, but the disclosure is not limited thereto.

The device substrate 100 includes a substrate 110, a first pad 121, a second pad 122, a plurality of first power lines 131, a plurality of second power lines 132, and a plurality of control units 150. The material of the substrate 110 may be glass, quartz, organic polymer, or an opaque/reflective material (e.g., conductive material, metal, wafer, ceramic) or other suitable material. If a conductive material or metal is used, an insulating layer (not shown) may be disposed on the surface of the substrate 110 to avoid short circuit. The first pad 121, the second pad 122, the first power lines 131, the second power lines 132, and the control units 150 may be formed on the substrate 110 by a general semiconductor process. Therefore, the materials or formation manners of the first pad 121, the second pad 122, the first power lines 131, the second power lines 132, and the control units 150 are not described herein.

The first pad 121 is located on the first side 101 of the device substrate 100. The second pad 122 is located on the second side 102 of the device substrate 100. In other words, in a top view (e.g., facing the paper surface of FIG. 1A), the first pad 121 and the second pad 122 are respectively located on opposite sides of the device substrate 100. Moreover, the first pad 121 does not overlap the second pad 122 in the first direction 101a perpendicular to the first side 101 or in the second direction 102a perpendicular to the second side 102.

In the embodiment, the first direction 101a is substantially parallel to the second direction 102a, but the disclosure is not limited thereto. In an embodiment not shown, the device substrate (not shown) may not be of a parallelogram type.

In the embodiment, the first pad 121 may not overlap the second pad 122 in the third direction 103a perpendicular to the third side 103 or in the fourth direction 104a perpendicular to the fourth side 104.

In the embodiment, the third direction 103a is substantially parallel to the fourth direction 104a, but the disclosure is not limited thereto.

In the embodiment, the first pad 121 and the second pad 122 overlap with the center 105 of the device substrate 100. In other words, if the device substrate 100 is placed on a plane (e.g., the plane of the paper of FIG. 1A) and then rotated by 180 degrees (180°) along an axis passing through the center 105 (e.g., a virtual rotational axis passing through the center 105 in FIG. 1A and ejecting or injecting into the plane of the paper), the position of the rotated second pad 122 may overlap (including completely overlap or partially overlap) the position of the non-rotated first pad 121, and the position of the rotated first pad 121 may be overlapped with the position of the non-rotated second pad 122. That is, the first pad 121 and the second pad 122 are substantially disposed on the substrate 110 in a manner of 2-fold rotational symmetry, but the disclosure is not limited thereto.

In the embodiment, the first pad 121 may be electrically connected to the control units 150 by the first power lines 131, or the second pad 122 may be electrically connected to the control units 150 by the second power line 132. For example, referring to FIG. 1B, the control unit 150 may include a switching device 151 and a driving device 152. The switching device 151 may be a transistor having a source S1, a drain D1 and a gate G1, and the driving device 152 may be a transistor having a source S2, a drain D2 and a gate G2. The gate G1 of the switching device 151 may be electrically connected to the corresponding first signal line 141, the source S1 of the switching device 151 may be electrically connected to the corresponding second signal line 142, the drain D1 of the switching device 151 is electrically connected to the gate G2 of the driving device 152, and the source S2 of the driving device 152 is electrically connected to the first power line 131. In the operation of the control unit 150, the switching device 151 may control the on (conduction) and the off (open) of the driving device 152 by the signals transmitted via the corresponding first signal line 141 and the corresponding second signal line 142. When the driving device 152 is turned on (conduction), the driving device 152 can allow its source S2 to transfer the driving potential provided by the first power line 131 to its drain D2.

In an embodiment, the first pad 121 or the second pad 122 may be used as a common voltage and a large current in application. For example, the first pad 121 may be electrically connected to a common power supply voltage source (OVDD, not shown), and the second pad 122 may be electrically connected to a common output voltage swings source (OVSS, not shown). By disposing the first pad 121 and the second pad 122 on the side(s) of the device substrate 100 (e.g., the first side 101, the second side 102, the third side 103, and/or the fourth side 104), the first pad 121 and the second pad 122 may be configured to withstand a large load current. Moreover, by disposing the first pad 121 and the second pad 122 on two opposite sides of the device substrate 100 (e.g., two sides of the first side 101, the second side 102, the third side 103 and the fourth side 104, and the aforementioned two sides are opposite to each other), the thermal energy generated by the shared large current during the operation of the device substrate 100 may be dispersed, and the power supply quality or safety of the device substrate 100 may be improved.

In the embodiment, the first pad 121 and the second pad 122 are respectively located on two different shorter sides of the device substrate 100 (e.g., the first side 101 and the second side 102 in the embodiment), but the disclosure is not limited thereto.

In the embodiment, the first pad 121 has a length D1, and the second pad 122 has a length D2. The length relationship between the length L1 of the first side 101, the length D1 of the first pad 121 and the length D2 of the second pad 122 may satisfy the following mathematical relationship: $60\%<(D2)/(L1-D1)<98\%$. Or, the length relationship between the length L2 of the second side 102, the length D1 of the first pad 121 and the length D2 of the second pad 122 may satisfy the following mathematical relationship: $60\%<(D2)/(L2-D1)<98\%$. Since the aforementioned length relationship(s) is/are more than 60%, the contact area of the pad(s) (e.g., at least one of the first pad 121 or the second pad 122) which is/are used for the common voltage and/or the large current may be increased, so that the contact resistance may be lowered to reduce power consumption, and the possibility of driving abnormality may be reduced, and the quality of the device substrate 100 may be further improved. Moreover, since the aforementioned length relationship(s) is/are less than 98%, a process window may be preferably produced in the fabrication or subsequent application of the device substrate 100. In other words, even if the fabrication or subsequent application of the device substrate 100 may have slight thermal expansion and contraction of the substrate 110, possibility of alignment or displacement in the process, the device substrate 100 has a better quality since the aforementioned length relationship is less than 98%.

In an embodiment, the length relationship between the length L1 of the first side 101 and the length D1 of the first pad 121 further satisfies the following mathematical relationship: $D1/L1>30\%$. Or, the length relationship between the length L2 of the second side 102 and the length D2 of the second pad 122 further satisfies the following mathematical relationship: $D2/L2>30\%$. In this way, the contact area(s) of the pad(s) (for example, at least one of the first pad 121 or the second pad 122) as a common voltage and/or a large current may be increased, so that the contact resistance may be lowered to reduce power consumption, and the possibility of driving abnormality may be reduced, and the quality of the device substrate 100 may be further improved.

Figure 2:
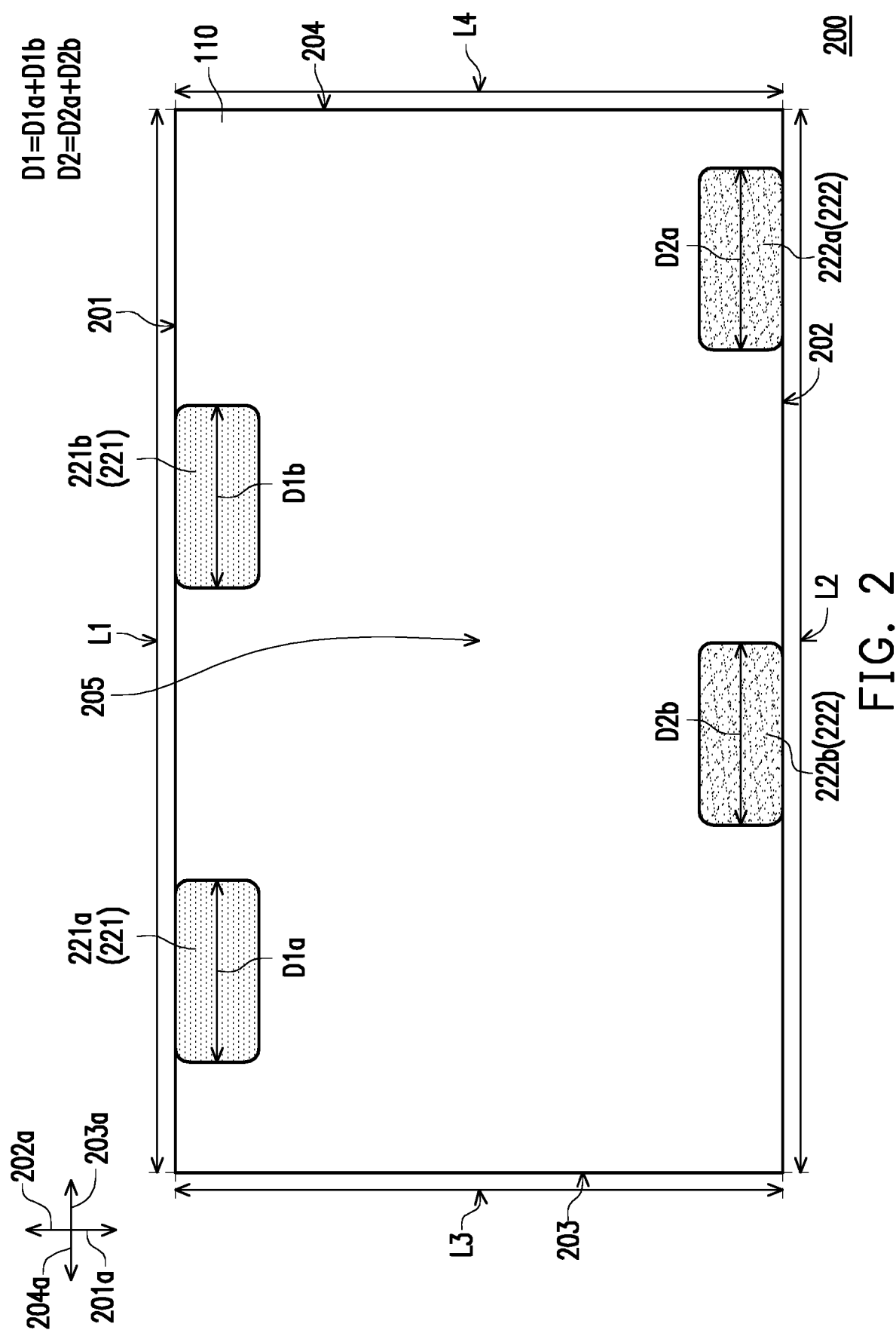
FIG. 2 is a top view of a device substrate of a second embodiment of the disclosure.

FIG. 2 is a top view of a device substrate of a second embodiment of the disclosure. The device substrate 200 of the embodiment is similar to the device substrate 100 of the first embodiment, and similar components are marked by identical or similar reference numerals and have similar function, material, or may be formed in a similar manner, and thus relevant descriptions are omitted hereinafter. In addition, a part of the film layer or device is omitted in FIG. 2 for clarity. For example, the first power lines (not shown), the second power lines (not shown), and the control units (not shown) are omitted in FIG. 2, and the configuration, function, material or formation manner thereof may be the same or similar to the first power lines 131, the second power lines 132, and the control units 150 in the first embodiment.

In the embodiment, the first side 201 has a length L1, the second side 202 has a length L2, the third side 203 has a length L3, and the fourth side 204 has a length L4. The length L1 of the first side 201 and the length L2 of the second side 202 are greater than the length L3 of the third side 203 and the length L4 of the fourth side 204. That is, the first pad 221 and the second pad 222 are respectively located on two different longer sides of the device substrate 200 (e.g., the first side 201 and the second side 202 in the embodiment). The first pad 221 may be electrically connected to the first power lines (not shown in FIG. 2, but same or similar to the first power lines 131). The second pad 222 may be electrically connected to the second power lines (not shown in FIG. 2, but same or similar to the second power lines 132).

In the embodiment, the first pad 221 may include a plurality of portions separated from each other, and the second pad 222 may include a plurality of portions separated from each other. For example, the first pad 221 may include two first pad portions 221a, 221b separated from each other, and the second pad 222 may include two second pad portions 222a, 222b separated from each other, but the number of the first pad portions (e.g., first pad portions 221a, 221b) and/or the number of the second pad portions (e.g., second pad portions 222a, 222b) are not limited in the present disclosure.

In the embodiment, a first pad portion 221a and/or another first pad portion 221b do not overlap to a second pad portion 222a and/or another second pad portion 222b combinedly or separately in the first direction 201a perpendicular to the first side 201 or in the second direction 202a perpendicular to the second side 202. That is, the first pad 221 does not overlap the second pad 222 in the first direction 201a perpendicular to the first side 201 or in the second direction 202a perpendicular to the second side 202.

In addition, taking FIG. 2 as an example, in a different way of description, a first pad portion 221a in FIG. 2 may be referred to as a first pad, a second pad portion 222a in FIG. 2 may be referred to as a second pad, another first pad portion 221b in FIG. 2 may be referred to as a third pad, and another second pad portion 222b in FIG. 2 may be referred to as a fourth pad. Alternatively, a first pad portion 221b in FIG. 2 may be referred to as a first pad, and a second pad portion 222b in FIG. 2 may be referred to as a second pad, another first pad portion 221a in FIG. 2 may be referred to as a third pad, and another second pad portion 222a in FIG. 2 may be referred to as a fourth pad.

In the embodiment, a first pad portion 221a and/or another first pad portion 221b do not overlap to a second pad portion 222a and/or another second pad portion 222b combinedly or separately in the third direction 203a perpendicular to the third side 203 or in the fourth direction 204a perpendicular to the fourth side 204. That is, the first pad 221 does not overlap the second pad 222 in the third direction 203a perpendicular to the third side 203 or in the fourth direction 204a perpendicular to the fourth side 204.

In the embodiment, a first pad portion 221a and a second pad portion 222a overlap (including completely overlap or partially overlap) with the center 205 of the device substrate 200, and/or another first pad portion 221b and another second pad portion 222b overlap (including completely overlap or partially overlap) with the center 205 of the device substrate 200. That is, a first pad portion 221a and a second pad portion 222b are substantially disposed in a manner of 2-fold rotational symmetry, and/or another first pad portion 221b and another second pad portion 222b are substantially disposed in a manner of 2-fold rotational symmetry, but the disclosure is not limited thereto.

In the embodiment, a first pad portion 221a has a length D1a, another first pad portion 221b has a length D1b, a second pad portion 222a has a length D2a, and another second pad portion 222b has a length. D2b. That is, the length D1 of the first pad 221 may be the sum of the lengths D1a, D1b of the plurality of first pad portions 221a, 221b (e.g., the following mathematical relationship in the embodiment: D1=D1a+D1b), the length D2 of the second pad 222 may be the sum of the lengths D2a, D2b of the plurality of second pad portions 222a, 222b (e.g., the following mathematical relationship in the embodiment: D2=D2a+D2b). Moreover, the length relationship between the length L1 of the first side 201, the length D1 of the first pad 221 and the length D2 of the second pad 222 may satisfy the following mathematical relationship: 60%<(D2)/(L1−D1)<98%. Or, the length relationship between the length L2 of the second side 202, the length D1 of the first pad 221 and the length D2 of the second pad 222 may satisfy the following mathematical relationship: 60%<(D2)/(L2−D1)<98%. In this way, the contact area(s) of the pad(s) (for example, at least one of the first pad 221 or the second pad 222) as a common voltage and/or a large current may be increased, so that the contact resistance may be lowered to reduce power consumption, and the possibility of driving abnormality may be reduced, and the quality of the device substrate 200 may be further improved. And/or, even if the fabrication or subsequent application of the device substrate 200 may have slight thermal expansion and contraction of the substrate 110, possibility of alignment or displacement in the process, the device substrate 200 has a better quality.

In an embodiment, the length relationship between the length L1 of the first side 201 and the length D1 of the first pad 221 further satisfies the following mathematical relationship: D1/L1>30%. Or, the length relationship between the length L2 of the second side 202 and the length D2 of the second pad 222 further satisfies the following mathematical relationship: D2/L2>30%. In this way, the contact area(s) of the pad(s) (for example, at least one of the first pad 221 or the second pad 222) as a common voltage and/or a large current may be increased, so that the contact resistance may be lowered to reduce power consumption, and the possibility of driving abnormality may be reduced, and the quality of the device substrate 200 may be further improved.

In the embodiment, the plurality of first pad portions 221a, 221b may be electrically connected to each other, and/or the plurality of second pad portions 222a, 222b may be electrically connected to each other, but the disclosure is not limited thereto. In a possible embodiment, the plurality of first pad portions 221a, 221b may not be electrically connected to each other but have the same potential (e.g., electrically connected to voltage sources having the same or similar voltage, respectively), and/or the plurality of second pad portions 222a, 222b may not be electrically connected to each other but have the same potential (e.g., electrically connected to voltage sources having the same or similar voltage, respectively).

Figure 3:
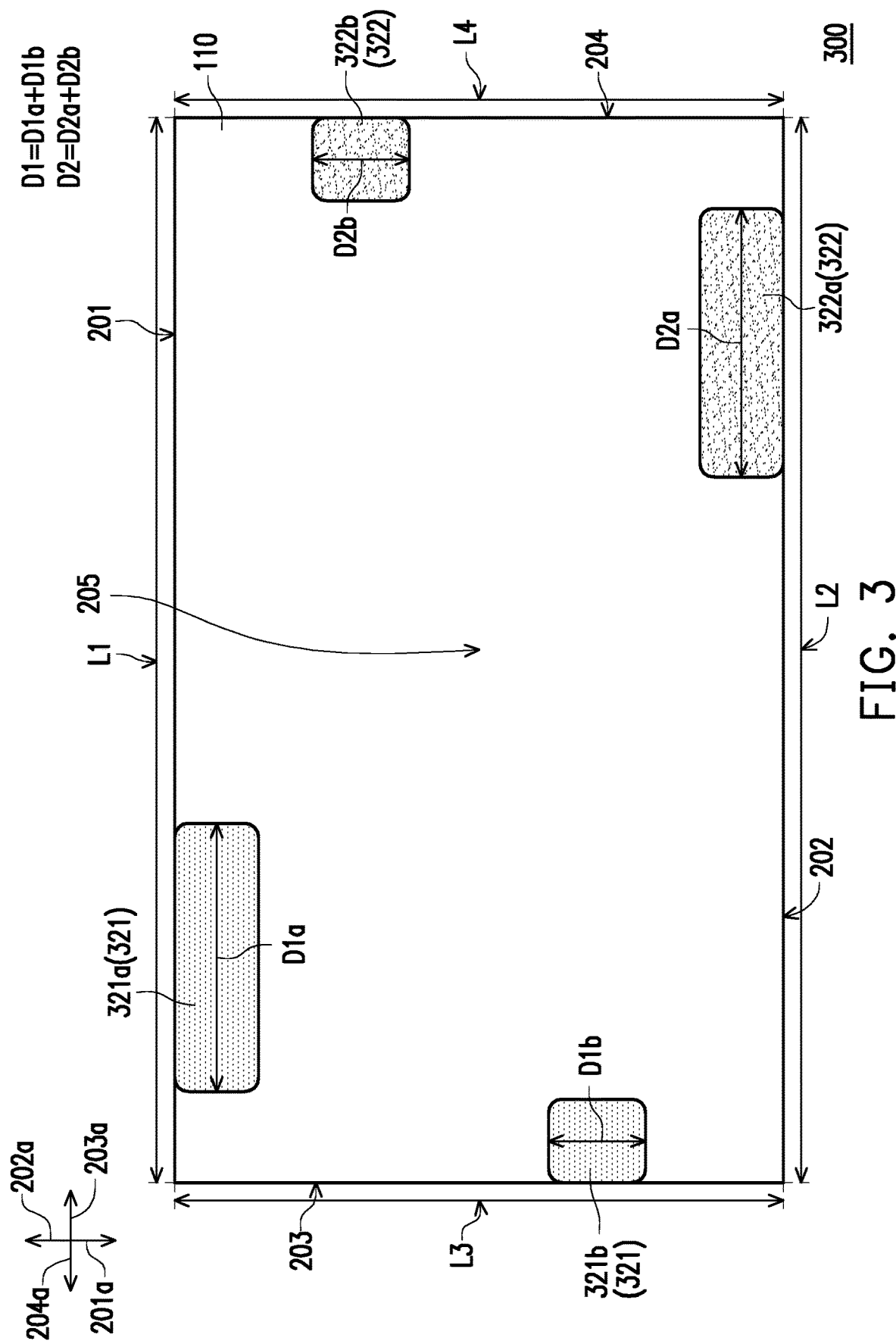
FIG. 3 is a top view of a device substrate of a third embodiment of the disclosure.

FIG. 3 is a top view of a device substrate of a third embodiment of the disclosure. The device substrate 300 of the embodiment is similar to the device substrate 100 of the first embodiment or the device substrate 200 of the second embodiment, and similar components are marked by identical or similar reference numerals and have similar function, material, or may be formed in a similar manner, and thus relevant descriptions are omitted hereinafter. In addition, a part of the film layer or device is omitted in FIG. 3 for clarity. For example, the first power lines (not shown), the second power lines (not shown), and the control units (not shown) are omitted in FIG. 3, and the configuration, function, material or formation manner thereof may be the same or similar to the first power lines 131, the second power lines 132, and the control units 150 in the first embodiment.

In the embodiment, the first pad 321 may include two first pad portions 321a, 321b separated from each other, and the second pad 322 may include two second pad portions 322a, 322b separated from each other. A first pad portion 321a is located on the first side 201 of the device substrate 300. A second pad portion 322a is located on the second side 202 of the device substrate 300. Another first pad portion 321b is located on the third side 203 of the device substrate 300. Another second pad portion 322b is located on the fourth side 204 of the device substrate 300. That is, the first pad 321 and the second pad 322 are respectively located on two different shorter sides of the device substrate 300 (e.g., the first side 201 and the second side 202 in the embodiment) and/or two different longer sides (e.g., the third side 203 and the fourth side 204 in the embodiment). The first pad 321 may be electrically connected to the first power lines (not shown in FIG. 3, but same or similar to the first power lines 131). The second pad 322 may be electrically connected to the second power lines (not shown in FIG. 3, but same or similar to the second power lines 132).

In addition, taking FIG. 3 as an example, in a different way of description, a first pad portion 321a in FIG. 3 may be referred to as a first pad, a second pad portion 322a in FIG. 3 may be referred to as a second pad, another first pad portion 321b in FIG. 3 may be referred to as a third pad, and another second pad portion 322b in FIG. 3 may be referred to as a fourth pad. Alternatively, a first pad portion 321b in FIG. 3 may be referred to as a first pad, and a second pad portion 322b in FIG. 3 may be referred to as a second pad, another first pad portion 321a in FIG. 3 may be referred to as a third pad, and another second pad portion 322a in FIG. 3 may be referred to as a fourth pad.

In the embodiment, a first pad portion 321a does not overlap a second pad portion 322a in the first direction 201a perpendicular to the first side 201 or in the second direction 202a perpendicular to the second side 202. And, another first pad portion 321b does not overlap another second pad portion 322b in the third direction 203a perpendicular to the third side 203 or in the fourth direction 204a perpendicular to the fourth side 204. That is, the first pad 321 does not overlap the second pad 322 in the first direction 201a perpendicular to the first side 201 or in the second direction 202a perpendicular to the second side 202, and in the third direction 203a perpendicular to the third side 203 or in the fourth direction 204a perpendicular to the fourth side 204.

In the embodiment, a first pad portion 321a does not overlap a second pad portion 322a in the third direction 203a perpendicular to the third side 203 or in the fourth direction 204a perpendicular to the fourth side 202. And, another first pad portion 321b does not overlap another second pad portion 322b in the first direction 201a perpendicular to the first side 201 or in the second direction 202a perpendicular to the second side 202. That is, the first pad 321 does not overlap the second pad 322 in the first direction 201a perpendicular to the first side 201, in the second direction 202a perpendicular to the second side 202, in the third direction 203a perpendicular to the third side 203, and in the fourth direction 204a perpendicular to the fourth side 204.

In the embodiment, a first pad portion 321a and a second pad portion 322a overlap (including completely overlap or partially overlap) with the center 205 of the device substrate 300, and/or another first pad portion 321b and another second pad portion 322b overlap (including completely overlap or partially overlap) with the center 205 of the device substrate 300. That is, a first pad portion 321a and a second pad portion 322b are substantially disposed in a manner of 2-fold rotational symmetry, and/or another first pad portion 321b and another second pad portion 322b are substantially disposed in a manner of 2-fold rotational symmetry, but the disclosure is not limited thereto.

In the embodiment, a first pad portion 321a has a length D1a, another first pad portion 321b has a length D1b, a second pad portion 322a has a length D2a, and another second pad portion 322b has a length D2b.

In the embodiment, the length relationship between the length L1 of the first side 201, the length D1a of the first pad portion 321a and the length D2a of the second pad portion 322a satisfies the following mathematical relationship: $60\% < (D2a)/(L1-D1a) < 98\%$. Or, the length relationship between the length L2 of the second side 202, the length D1a of the first pad portion 321a and the length D2a of the second pad portion 322a satisfy the following mathematical relationship: $60\% < (D2a)/(L2-D1a) < 98\%$. The length relationship between the length L3 of the third side 203, the length D1b of another first pad portion 321b, and the length D2b of another second pad portion 322b satisfies the following mathematical relationship: $60\% < (D2b)/(L3-D1b) < 98\%$. Or, the length relationship between the length L4 of the fourth side 204, the length D1b of another first pad portion 321b, and the length D2b of another second pad portion 322b satisfies the following mathematical relationship: $60\% < (D2b)/(L4-D1b) < 98\%$. In this way, the contact area(s) of the pad(s) (for example, at least one of the first pad 321 or the second pad 322) as a common voltage and/or a large current may be increased, so that the contact resistance may be lowered to reduce power consumption, and the possibility of driving abnormality may be reduced, and the quality of the device substrate 300 may be further improved. And/or, even if the fabrication or subsequent application of the device substrate 300 may have slight thermal expansion and contraction of the substrate 110, possibility of alignment or displacement in the process, the device substrate 300 has a better quality.

In an embodiment, the length relationship between the length L1 of the first side 201 and the length D1a of the first pad portion 321a further satisfies the following mathematical relationship: $D1a/L1 > 30\%$. Or, the length relationship between the length L2 of the second side 202 and the length D2a of the second pad portion 322a further satisfies the following mathematical relationship: $D2a/L2 > 30\%$. Or, the length relationship between the length L3 of the third side 203 and the length D1b of the first pad portion 321b further satisfies the following mathematical relationship: $D1b/L3 > 30\%$. Or, the length relationship between the length L4 of the fourth side 204 and the length D2b of the second pad portion 322b further satisfies the following mathematical relationship: $D2b/L4 > 30\%$. In this way, the contact area(s) of the pad(s) (for example, at least one of the first pad portion 321a, the second pad portion 322a, the first pad portion 321b, or the second pad portion 322b) as a common voltage and/or a large current may be increased, so that the contact resistance may be lowered to reduce power consumption, and the possibility of driving abnormality may be reduced, and the quality of the device substrate 300 may be further improved.

In the embodiment, the plurality of first pad portions 321a, 321b may be electrically connected to each other, and/or the plurality of second pad portions 322a, 322b may be electrically connected to each other, but the disclosure is not limited thereto. In a possible embodiment, the plurality of first pad portions 321a, 321b may not be electrically connected to each other but have the same potential (e.g., electrically connected to voltage sources having the same or similar voltage, respectively), and/or the plurality of second pad portions 322a, 322b may not be electrically connected to each other but have the same potential (e.g., electrically connected to voltage sources having the same or similar voltage, respectively).

Figure 4:
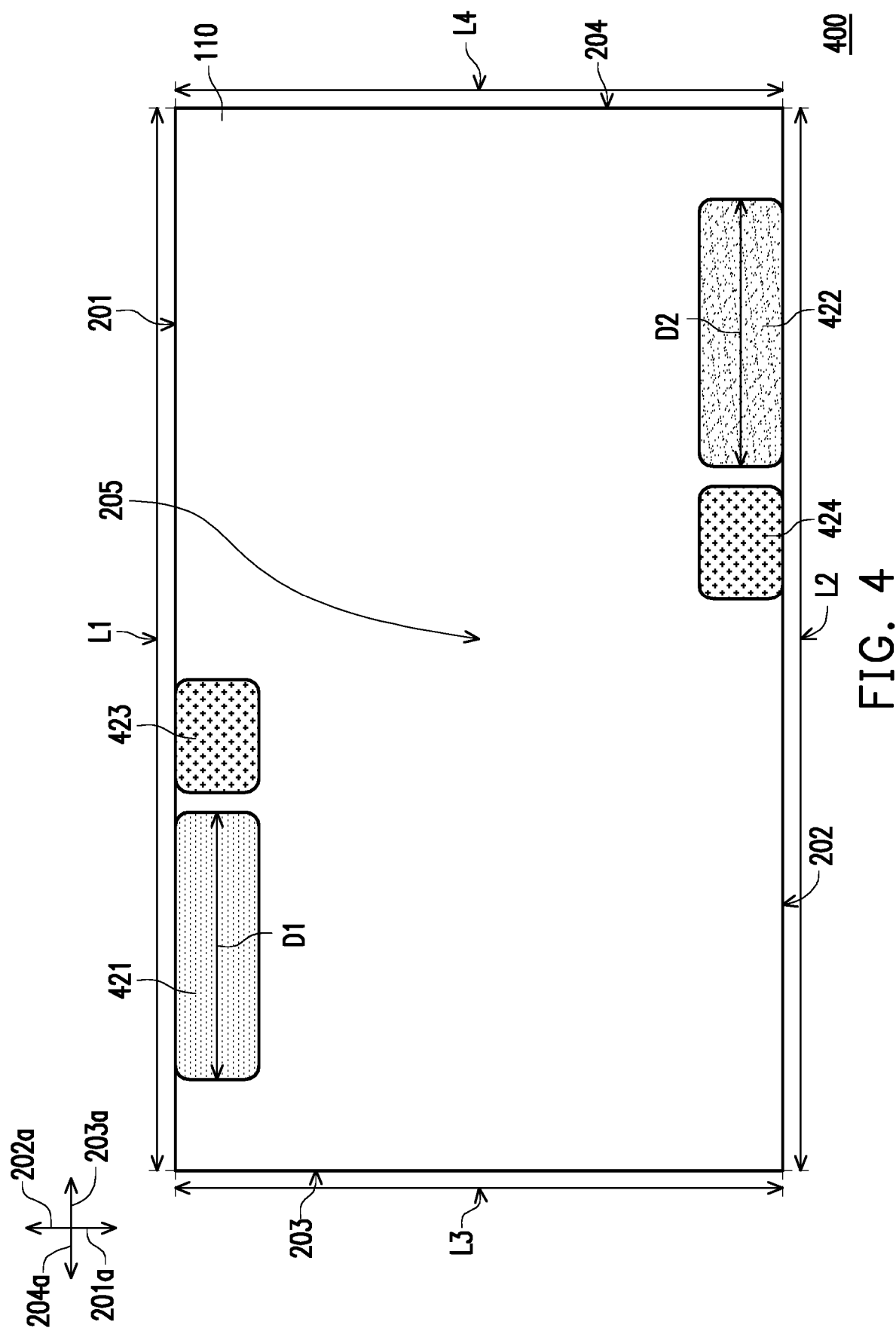
FIG. 4 is a top view of a device substrate of a fourth embodiment of the disclosure.

FIG. 4 is a top view of a device substrate of a fourth embodiment of the disclosure. The device substrate 400 of the embodiment is similar to the device substrate 100 of the first embodiment or the device substrate 200 of the second embodiment, and similar components are marked by identical or similar reference numerals and have similar function, material, or may be formed in a similar manner, and thus relevant descriptions are omitted hereinafter. In addition, a part of the film layer or device is omitted in FIG. 4 for clarity. For example, the first power lines (not shown), the second power lines (not shown), and the control units (not shown) are omitted in FIG. 4, and the configuration, function, material or formation manner thereof may be the same or similar to the first power lines 131, the second power lines 132, and the control units 150 in the first embodiment.

In the embodiment, the first pad 421 and the second pad 422 are respectively located on two different longer sides of the device substrate 400 (e.g., the first side 201 and the second side 202 in the embodiment). The first pad 421 may be electrically connected to the first power lines (not shown in FIG. 4, but same or similar to the first power lines 131). The second pad 422 may be electrically connected to the second power lines (not shown in FIG. 4, but same or similar to the second power lines 132).

In the embodiment, the device substrate 400 may further include at least one third pad 423 and/or at least one fourth pad 424. Only one third pad 423 and only one fourth pad 424 are schematically illustrated in FIG. 4, but the number of the third pads 423 and the number of the fourth pads 424 are not limited in the present disclosure.

In the embodiment, the third pad 423 may be electrically separated from the first pad 421 and/or the second pad 422, but the disclosure is not limited thereto.

In the embodiment, the fourth pad 424 may be electrically separated from the first pad 421 and/or the second pad 422, but the disclosure is not limited thereto.

For example, the third pad 423 may be electrically connected to the gate G1 (shown in FIG. 1B) of the corresponding switching device 151 (shown in FIG. 1B) via the corresponding first signal line 141 (shown in FIG. 1B), the fourth pad 424 may be electrically connected to the source S1 (shown in FIG. 1B) of the corresponding switching device 151 (shown in FIG. 1B) by the corresponding second signal line 142 (shown in FIG. 1B). The switching device 151 can control the on (conduction) and the off (open) of the driving device 152 by the signals transmitted via the corresponding first signal line 141 from the corresponding third pad 423 and the corresponding second signal line 142 from the corresponding fourth pad 424.

In the embodiment, in the first direction 201a perpendicular to the first side 201 or in the second direction 202a perpendicular to the second side 202, the first pads 421 does not overlap the second pads 422 and/or the fourth pad 424, the third pad 423 does not overlap the second pad 422 and/or the fourth pad 424, the second pad 422 does not overlap the first pad 421 and/or the third pad 423, and the fourth pad 424 does not overlap the first pad 421 and/or the third pad 423. That is, in the first direction 201a perpendicular to the first side 201 or in the second direction 202a perpendicular to the second side 202, the first pad 421, the second pad 422, the third pad 423 and the fourth pads 424 may not overlap each other.

In the embodiment, in the third direction 203a perpendicular to the third side 203 or in the fourth direction 204a perpendicular to the fourth side 204, the first pads 421 does not overlap the second pads 422 and/or the fourth pad 424, the third pad 423 does not overlap the second pad 422 and/or the fourth pad 424, the second pad 422 does not overlap the first pad 421 and/or the third pad 423, and the fourth pad 424 does not overlap the first pad 421 and/or the third pad 423.

In the embodiment, the first pad 421 and the second pad 422 overlap with the center 205 of the device substrate 400, and/or the third pad 423 and the fourth pad 424 overlap with the center 205 of the device substrate 400. That is, the first pad 421 and the second pad 422 are substantially disposed in a manner of 2-fold rotational symmetry, and/or the third pad 423 and the fourth pad 424 are substantially disposed in a manner of 2-fold rotational symmetry, but the disclosure is not limited thereto.

In the embodiment, the first pad 421 has a length D1, the second pad 422 has a length D2, and the length relationship between the length L1 of the first side 201, the length D1 of the first pad 421 and the length D2 of the second pad 422 may satisfy the following mathematical relationship: $60\% < (D2)/(L1-D1) < 98\%$. Or, the length relationship between the length L2 of the second side 202, the length D1 of the first pad 421 and the length D2 of the second pad 422 may satisfy the following mathematical relationship: $60\% < (D2)/(L2-D1) < 98\%$. In this way, the contact area(s) of the pad(s) (for example, at least one of the first pad 421 or the second pad 422) as a common voltage and/or a large current may be increased, so that the contact resistance may be lowered to reduce power consumption, and the possibility of driving abnormality may be reduced, and the quality of the device substrate 400 may be further improved. And/or, even if the fabrication or subsequent application of the device substrate 400 may have slight thermal expansion and contraction of the substrate 110, possibility of alignment or displacement in the process, the device substrate 400 has a better quality.

In an embodiment, the length relationship between the length L1 of the first side 201 and the length D1 of the first pad 421 further satisfies the following mathematical relationship: $D1/L1 > 30\%$. Or, the length relationship between the length L2 of the second side 202 and the length D2 of the second pad 422 further satisfies the following mathematical relationship: $D2/L2 > 30\%$. In this way, the contact area(s) of the pad(s) (for example, at least one of the first pad 421 or the second pad 422) as a common voltage and/or a large current may be increased, so that the contact resistance may be lowered to reduce power consumption, and the possibility of driving abnormality may be reduced, and the quality of the device substrate 400 may be further improved.

It is to be noted that the disclosure does not limit the manner in which the device substrates 100, 200, 300, 400 are used. For example, the disclosure does not limit that the device substrates 100, 200, 300, 400 have to be constituted the display panel of the subsequent embodiment. That is, the application of the device substrates 100, 200, 300, and 400 may be adjusted according to requirements.

Based on the above, in the device substrate of the present disclosure, the first pad electrically connected to the first power lines and the second pad electrically connected to the second power lines are disposed on opposite sides of the device substrate. Moreover, in a direction perpendicular to one of the aforementioned two sides, the first pad does not overlap the second pad. In this way, the thermal energy generated by the shared large current during the operation of the device substrate may be dispersed, and the power supply quality or safety of the device substrate may be improved.

Figure 5A:
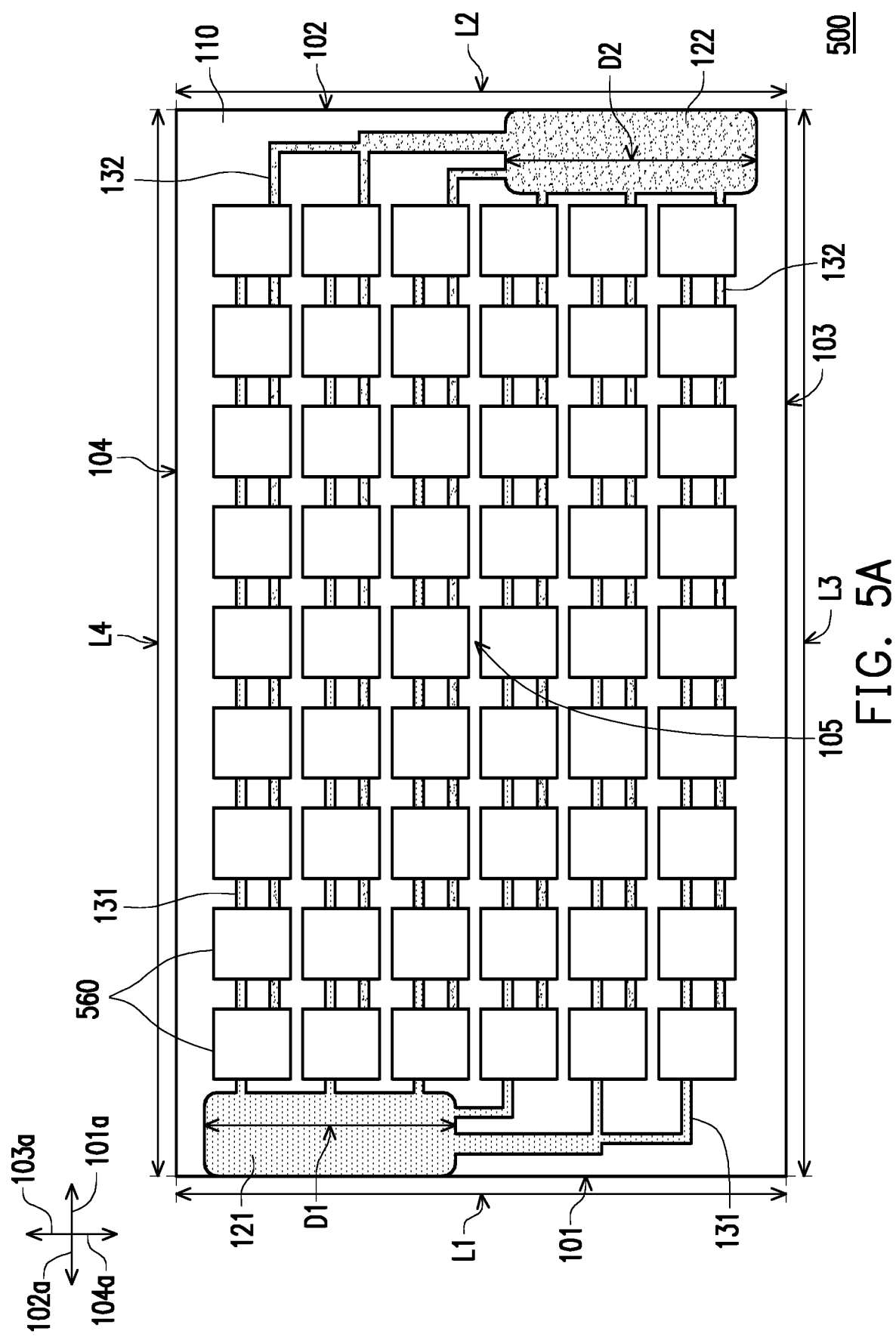
FIG. 5A is a top view of a display panel of an embodiment of the disclosure.
Figure 5B:
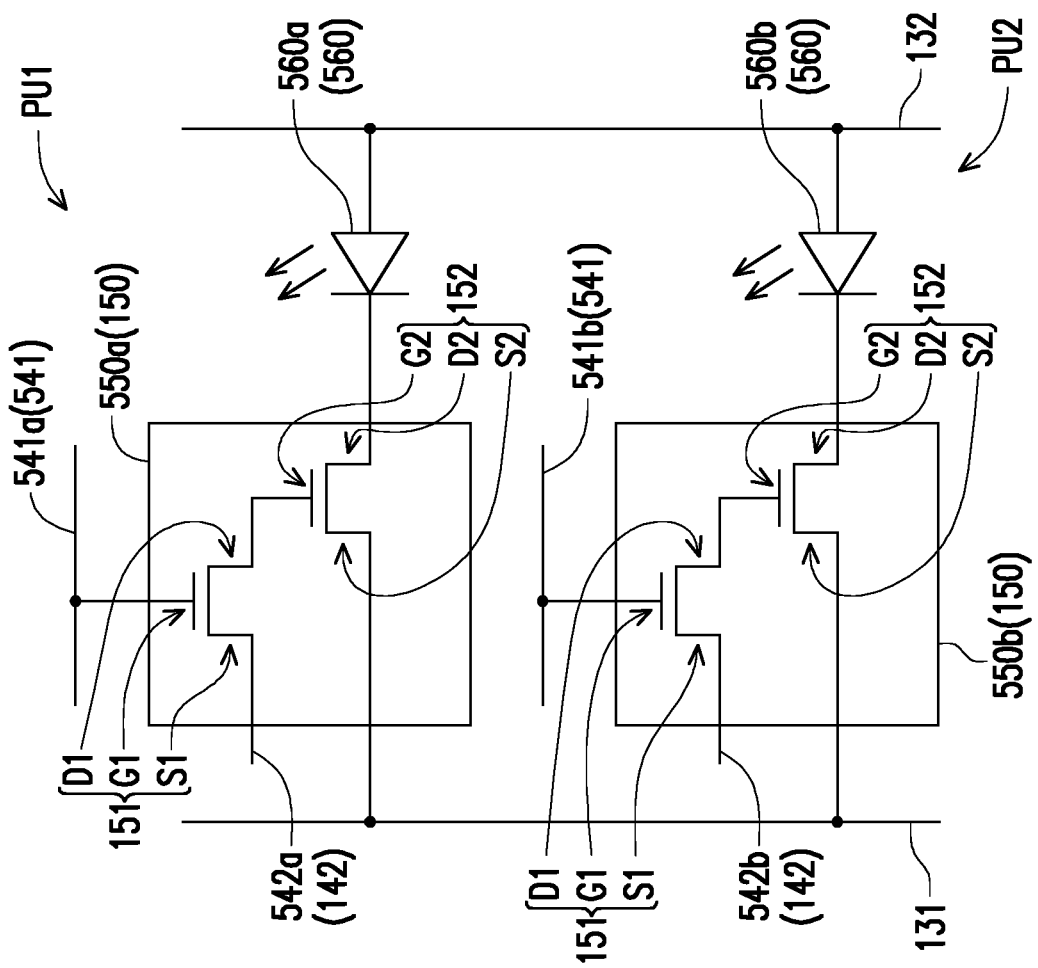
FIG. 5B is a circuit diagram of two pixel units of a display panel of an embodiment of the disclosure.

FIG. 5A is a top view of a display panel of a fifth embodiment of the disclosure. FIG. 5B is a circuit diagram of two pixel units of a display panel of an embodiment of the disclosure. In addition, a part of the film layer or device is omitted in FIGS. 5A and 5B for clarity.

In the embodiment, the device substrate used in the display panel 500 is exemplified by the device substrate 100 of the first embodiment, and similar components are marked by identical or similar reference numerals and have similar functions or configurations, and thus relevant descriptions are omitted hereinafter. It should be noted that in other embodiments not shown, the device substrate provided may be similar to the device substrate 100. For example, in other embodiments not shown, the device substrate used in the display panel may be the same or similar to the device substrate 200, the device substrate 300, or the device substrate 400.

Hereinafter, the device substrate used for the display panel 500 will be exemplified by the device substrate 100.

The display panel includes a device substrate 100 and a plurality of light emitting devices 560. The light emitting devices 560 are disposed on the device substrate 100 and electrically connected to the device substrate 100. The number, color, or arrangement of the light emitting devices 560 is not limited in the disclosure.

In an embodiment, the light emitting device(s) 560 may be electrically connected to the device substrate 100 by flip chip bonding, but the disclosure is not limited thereto. In another embodiment, the light emitting device(s) 560 may be electrically connected to the device substrate 100 by wire bonding.

In the embodiment, the control unit 150 may include a control unit 550a and another control unit 550b, the first signal line 141 may include a first signal line 541a and another first signal line 541b, and the second signal line 142 may include a second signal line 542a and another second signal line 542b. The function or configuration of the control unit 550a and the control unit 550b may be the same or similar to the function or configuration of the control unit 150, the function or configuration of the first signal line 541a and the first signal line 541b may be the same or similar to the function or configuration of the first signal line 141, and the function or configuration of the second signal line 542a and the second signal line 542b may be the same or similar to the function or configuration of the second signal line 142. The control unit 150 and the corresponding light emitting device 560 may constitute a pixel unit PU of the display panel. For example, the pixel unit PU1 may include a light emitting device 560a and a control unit 550a electrically connected to the light emitting device 560a, another pixel unit PU2 may include a light emitting device 560b and a control unit 550b electrically connected to the light emitting device 560b.

For example, the gate G1 of the switching device 151 of the control unit 550a may be electrically connected to the corresponding first signal line 541a, the source S1 of the switching device 151 of the control unit 550a may be electrically connected to the corresponding second signal line 542a, the source S2 of the driving device 152 of the control unit 550a may be electrically connected to the first pad 121 by the first power line 131, the drain D2 of the driving device 152 of the control unit 550a may be electrically connected to a light emitting device 560a, and the light emitting device 560a may be electrically connected to the second pad 122 by the second power line 132. Moreover, the gate G1 of the switching device 151 of the control unit 550b may be electrically connected to the corresponding first signal line 541b, the source S1 of the switching device 151 of the control unit 550b may be electrically connected to the corresponding second signal line 542b, the source S2 of the driving device 152 of the control unit 550b may be electrically connected to the first pad 121 by the first power line 131, the drain D2 of the driving device 152 of the control unit 550b may be electrically connected to a light emitting device 560b, and the light emitting device 560b may be electrically connected to the second pad 122 by the second power line 132.

It should be noted that the disclosure does not limit the manner in which the display panel 500 is used. For example, the disclosure does not limit that the display panel 500 has to be constituted the tiled display of the subsequent embodiment. That is, the application of the display panel 500 may be adjusted according to requirements.

Based on the above, the thermal energy generated by the shared large current during the operation of the device substrate may be dispersed, and the power supply quality or safety of the device substrate may be improved. Therefore, the thermal energy generated by the shared large current during the operation of the display panel including the device substrate may be dispersed, and the power supply quality or safety of the display panel may be improved.

Figure 6:
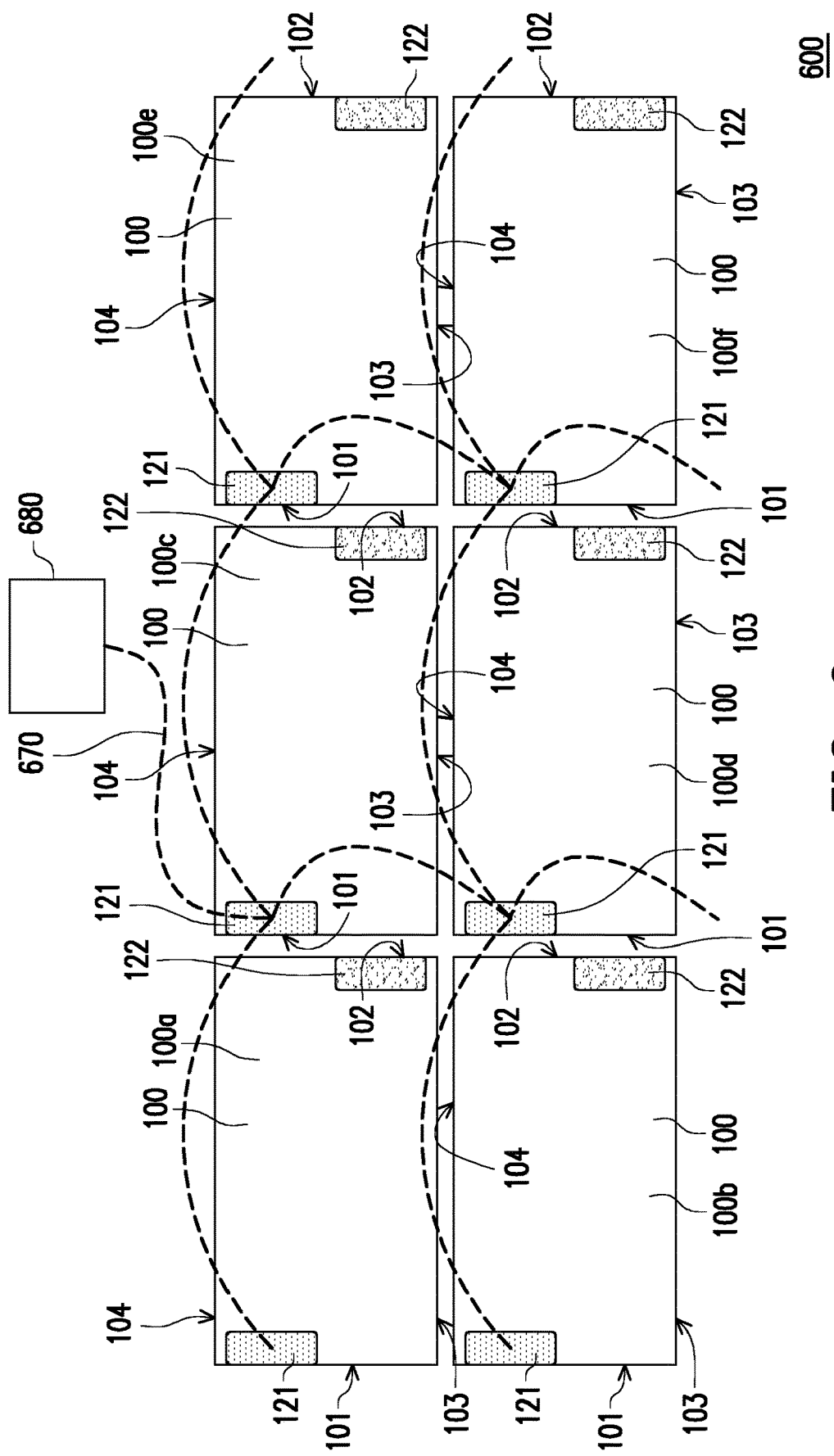
FIG. 6 is a top view of a tiled display of an embodiment of the disclosure.

FIG. 6 is a top view of a tiled display of an embodiment of the disclosure. In addition, a part of the film layer or device is omitted in FIG. 6 for clarity.

The tiled display 600 includes at least two display panels (e.g., a first display panel 100a and a second display panel 100b; a third display panel 100c and a fourth display panel 100d; a fifth display panel 100e and a sixth display panel 100f; a first display panel 100a and a third display panel 100c; a third display panel 100c and a fifth display panel 100e; a second display panel 100b and a fourth display panel 100d; or a fourth display panel 100d and a sixth display panel 100e), and the aforementioned at least two display panels are tiled in a side-by-side manner.

In the embodiment illustrated in FIG. 6, the tiled display 600 includes a first display panel 100a, a second display panel 100b, a third display panel 100c, a fourth display panel 100d, a fifth display panel 100e, and a sixth display panel 100f. The first display panel 100a, the second display panel 100b, the third display panel 100c, the fourth display panel 100d, the fifth display panel 100e, and the sixth display panel 100f are the same or similar to the display panel 100 of the foregoing embodiment. In addition, the device substrate used in the display panels 100a, 100b, 100c, 100d, 100e, and 100f is exemplified by the device substrate 100 of the first embodiment, and similar components are marked by identical or similar reference numerals and have similar functions or configurations, and thus relevant descriptions are omitted hereinafter. It should be noted that in other embodiments not shown, the device substrate provided may be similar to the device substrate 100. For example, in other embodiments not shown, the device substrate used in the display panels 100a, 100b, 100c, 100d, 100e, and 100f may be the same or similar to the device substrate 200, the device substrate 300, or the device substrate 400. That is, the first display panel 100a, the second display panel 100b, the third display panel 100c, the fourth display panel 100d, the fifth display panel 100e, and the sixth display panel 100f may be identical to each other or different from each other.

Hereinafter, the device substrate used for the display panels 100a, 100b, 100c, 100d, 100e, and 100f will be exemplified by the device substrate 100. Moreover, FIG. 6 only shows the outlines of the sides 101, 102, 103, 104, the first pads 121 and the second pads 122 of the device substrate 100 of each of the display panels 100a, 100b, 100c, 100d, 100e, 100f for clarity.

At least two of the first pad 121 of the first display panel 100a, the first pad 121 of the second display panel 100b, the first pad 121 of the third display panel 100c, the first pad 121 of the fourth display panel 100d, the first pad 121 of the fifth display panel 100e, and the first pad 121 of the sixth display panel 100f may be electrically connected to the power supply 680 by the same power line 670.

In the embodiment, the second side 102 of the first display panel 100a is adjacent to the first side 101 of the third display panel 100c, the second side 102 of the third display panel 100c is adjacent to the first side 101 of the fifth display panel 100e, the second side 102 of the second display panel 100b is adjacent to the first side 101 of the fourth display panel 100d, and the second side 102 of the fourth display panel 100d is adjacent to the first side 101 of the sixth display panel 100e, but the disclosure is not limited thereto.

Figure 7:
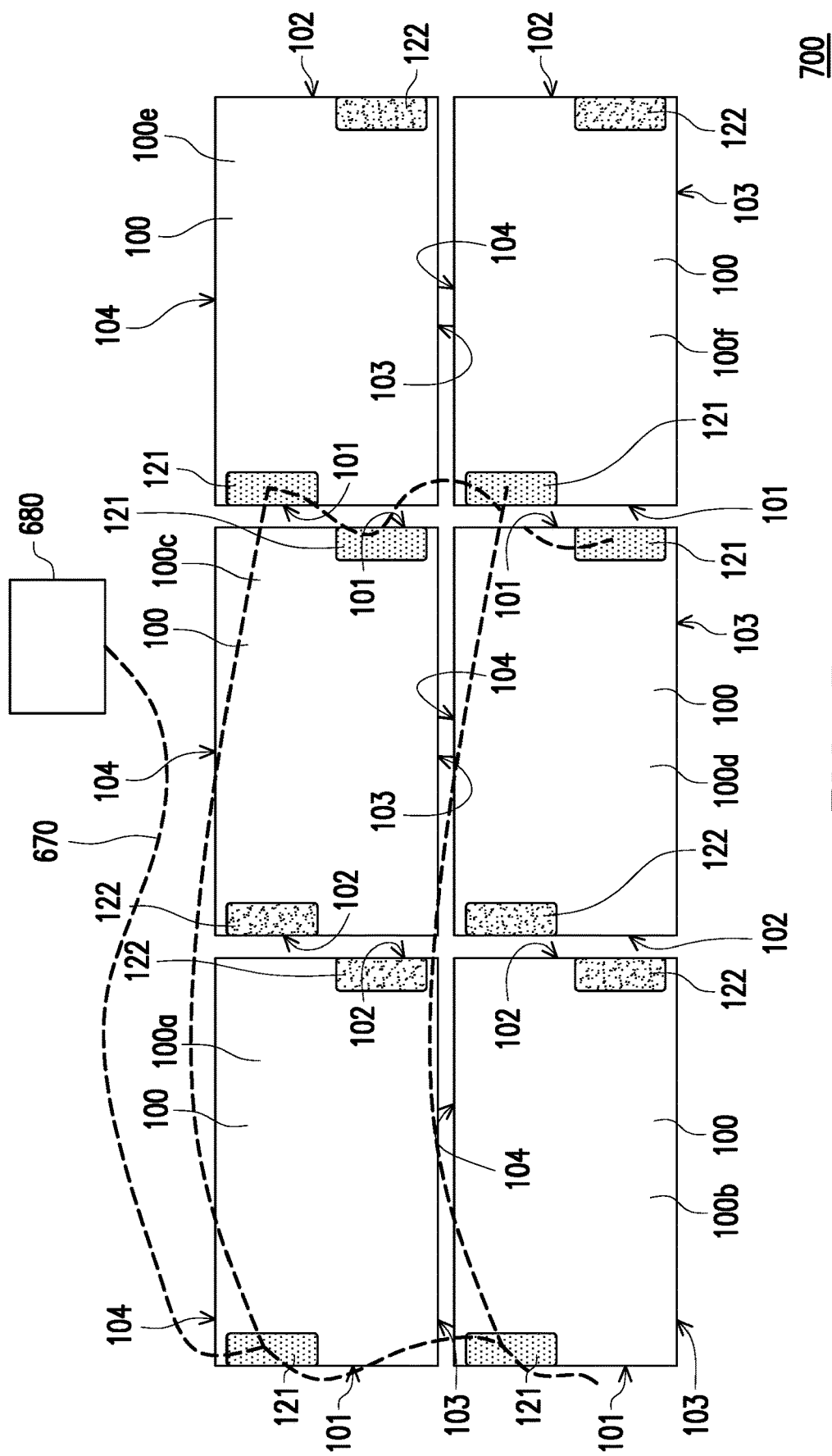
FIG. 7 is a top view of a tiled display of another embodiment of the disclosure.

FIG. 7 is a top view of a tiled display of another embodiment of the disclosure. The tiled display 700 of the embodiment is similar to the tiled display 600 of the previous embodiment, and similar components are marked by identical or similar reference numerals and have similar function, material, or may be formed in a similar manner, and thus relevant descriptions are omitted hereinafter. In addition, a part of the film layer or device is omitted in FIG. 7 for clarity. For example, FIG. 7 only shows the outlines of the sides 101, 102, 103, 104, the first pads 121 and the second pads 122 of the device substrate 100 of each of the display panels 100a, 100b, 100c, 100d, 100e, 100f.

In the embodiment, the second side 102 of the first display panel 100a is adjacent to the second side 102 of the third display panel 100c, the first side 101 of the third display panel 100c is adjacent to the first side 101 of the fifth display panel 100e, the second side 102 of the second display panel 100b is adjacent to the second side 102 of the fourth display panel 100d, and the first side 101 of the fourth display panel 100d is adjacent to the first side 101 of the sixth display panel 100e.

In the tiled display 700 in the embodiment, the configuration of the power line may be simpler or more efficient since either the first pads 121 having the same electrical properties or the second pads 122 having the same electrical properties may be adjacent in the two adjacent display panels (e.g., the first display panel 100a and the third display panel 100c; the third display panel 100c and the fifth display panel 100e; the second display panel 100b and the fourth display panel 100d; or the fourth display panel 100d and the sixth display panel 100e). In other words, two adjacent display panels may be configured in one of the following two configurations: two adjacent display panels are disposed adjacent to each other with the first pads 121 (configuration 1); two adjacent display panels are disposed adjacent to each other with the second pads 122 (configuration 2).

Based on the above, the thermal energy generated by the shared large current during the operation of the device substrate may be dispersed, and the power supply quality or safety of the device substrate may be improved. Therefore, the thermal energy generated by the shared large current during the operation of the tiled display including the display panels including the device substrate may be dispersed, and the power supply quality or safety of the tiled display may be improved.

The size of the light emitting device provided in the foregoing embodiments (e.g., the light emitting devices 560, 560a, 560b) is, for instance, smaller than 100 μm, preferably smaller than 50 μm but larger than 0 μm. The light emitting device may be, for example, an inorganic light emitting device. Structurally, the light emitting devices may be P-N diodes, P-I-N diodes, or may have other appropriate structures. The light emitting devices may be horizontal type-light emitting devices or flipchip type-light emitting devices. The light emitting devices may be made of an inorganic material (e.g., a perovskite material, a rare earth ion luminescent material, a rare earth fluorescent material, a semiconductor luminescent material, another suitable material, or a combination thereof), another suitable material, or a combination of the foregoing materials.

In the previous embodiments, the active device (e.g., switching device 151 or the driving device 152) may be a thin film transistor (TFT), such as a bottom gate transistor, a top gate transistor, a three-dimensional transistor, or another appropriate transistor. A gate electrode (e.g., gates G1, G2) of the bottom gate transistor may be located below a channel (not shown), a gate electrode (e.g., gates G1, G2) of the top gate transistor may be located above a channel (not shown), and a channel of the three-dimensional transistor is extended and not located on a plane. The channel may be of a single-layer structure or a multi-layer structure, and a material of the semiconductor layer includes amorphous silicon, microcrystalline silicon, nanocrystalline silicon, polysilicon, monocrystalline silicon, an organic semiconductor material, an oxide semiconductor material, a carbon nanotube/nanorod, a perovskite material, another suitable material, or a combination of the foregoing materials.

Besides, an active device (e.g., one of the switching device 151 or the driving device 152), another active device (e.g., the other one of the switching device 151 or the driving device 152), and the capacitor (not shown) may be simply referred to as two active devices and one capacitor (as 2T1C). In other embodiments, the number of the active device(s) and the capacitor(s) included in the pixel unit (e.g., pixel unit PU, PU1, PU2) may vary according to actual design, so that the active device(s) and the capacitor (s) may be simply referred to as three active devices and one or two capacitors (as 3T1C/2C), four active devices and one or two capacitors (as 4T1C/2C), five active devices and one or two capacitors (as 5T1C/2C), six active devices and one or two capacitors (as 6T1C/2C), or any other appropriate circuit configuration.

To sum up, in the device substrate of the present disclosure, the first pad electrically connected to the first power lines and the second pad electrically connected to the second power lines are disposed on opposite sides of the device substrate. Moreover, in a direction perpendicular to one of the aforementioned two sides, the first pad does not overlap the second pad. Therefore, the thermal energy generated by the shared large current during the operation of the device substrate, the display panels including thereof, or the tiled display including thereof may be dispersed, and the power supply quality or safety of the tiled display may be improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A device substrate comprising:
a substrate;
a first pad, disposed on a first side of the device substrate;
a second pad, disposed on a second side of the device substrate, wherein the second side is opposite to the first side;
a plurality of first power lines, electrically connected to the first pad;
a plurality of second power lines, electrically connected to the second pad; and a plurality of control units, electrically connected to at least one of the first power lines and the second power lines, wherein:
the first pad does not overlap the second pad in a first direction perpendicular to the first side or in a second direction perpendicular to the second side; and
the length of the first side is L1, the length of the second side is L2, the length of the first pad is D1, the length of the second pad is D2, and the following mathematical relationship is satisfied:
60%<(D2)/(L1−D1)<98%;
60%<(D2)/(L2−D1)<98%;
D1/L1>30%; and
D2/L2>30%.

2. The device substrate of claim 1, wherein the first pad is electrically separated from the second pad.

3. The device substrate of claim 1, wherein the first pad and the second pad have a 2-fold rotational symmetry form with respect to the center of the device substrate.

4. The device substrate of claim 1, further comprising:
a third pad, disposed on one of the first side or the second side of e device substrate, wherein:
the third pad does not overlap the first pad and the second pad in the first direction or in the second direction.

5. The device substrate of claim 4, wherein the third pad is electrically connected to one of the first pad or the second pad.

6. The device substrate of claim 4, wherein each of the control units includes a switching device and a driving device, the switching device is electrically connected to the driving device and the third pad, and the driving device is electrically connected to at least one of the first power line and the second power lines.

7. A display panel, comprising:
a device substrate comprising:
a substrate;
a first pad, disposed on a first side of the device substrate;
a second pad, disposed on a second side of the device substrate, wherein the second side is opposite to the first side;
a plurality of first power lines, electrically connected to the first pad;
a plurality of second power lines, electrically connected to the second pad; and
a plurality of control units, electrically connected to at least one of the first power lines and the second power lines, wherein:
the first pad does not overlap the second pad in a first direction perpendicular to the first side or in a second direction perpendicular to the second side; and
the length of the first side is L1, the length of the second side is L2, the length of the first pad is D1, the length of the second pad is D2, and the following mathematical relationship is satisfied:
60%<(D2)/(L1−D1)<98%;
60%<(D2)/(L2−D1)<98%;
D1/L1>30%; and
D2/L2>30%; and
a plurality of light emitting devices, disposed on the device substrate and electrically connected to the device substrate.

8. A tiled display, comprising:
a first display panel, comprising:
a first device substrate comprising:
a first substrate;
a first pad, disposed on a first side of the first device substrate;
a second pad, disposed on a second side of the first device substrate, wherein the second side is opposite to the first side;
a plurality of first power lines, electrically connected to the first pad;
a plurality of second power lines, electrically connected to the second pad; and
a plurality of first control units, electrically connected to at least one of the first power lines and the second power lines, wherein:
the first pad does not overlap the second pad in a first direction perpendicular to the first side or in a second direction perpendicular to the second side; and
the length of the first side is L1, the length of the second side is L2, the length of the first pad is D1, the length of the second pad is D2, and the following mathematical relationship is satisfied:
60%<(D2)/(L1−D1)<98%;
60%<(D2)/(L2−D1)<98%;
D1/L1>30%; and
D2/L2>30%; and
a plurality of first light emitting devices, disposed on the first device substrate and electrically connected to the first device substrate; and
a second display panel, comprising:
a second device substrate comprising:
a second substrate;
a third pad, disposed on a third side of the second device substrate;
a fourth pad, disposed on a fourth side of the second device substrate, wherein the fourth side is opposite to the third side;
a plurality of third power lines, electrically connected to the third pad;
a plurality of fourth power lines, electrically connected to the fourth pad; and
a plurality of second control units, electrically connected to at least one of the third power lines and the fourth power lines, wherein:
the third pad does not overlap the fourth pad in a third direction perpendicular to the third side or in a fourth direction perpendicular to the fourth side; and
the length of the third side is L3, the length of the fourth side is L4, the length of the third pad is D3, the length of the fourth pad is D4, and the following mathematical relationship is satisfied:
60%<(D4)/(L3−D3)<98%;
60%<(D4)/(L4−D3)<98%;
D3/L3>30%; and
D4/L4>30%; and
a plurality of second light emitting devices, disposed on the second device substrate and electrically connected to the second device substrate, wherein:
the first pad of the first display panel is electrically connected to the third pad of the second display panel; or
the second pad of the first display panel is electrically connected to the fourth pad of the second display panel.

9. The tiled display of claim 8, wherein either the first side of the first display panel is adjacent to the third side of the second display panel or the first side of the first display panel is adjacent to the fourth side of the second display panel.

* * * * *